United States Patent [19]
Nieman

[11] Patent Number: 4,572,600
[45] Date of Patent: Feb. 25, 1986

[54] ELECTRICAL CONNECTOR FOR TRANSIENT SUPPRESSION

[75] Inventor: Gerald R. Nieman, Glendale, Ariz.

[73] Assignee: ITT Corporation, New York, N.Y.

[21] Appl. No.: 706,683

[22] Filed: Feb. 28, 1985

[51] Int. Cl.[4] .......................... H01R 4/66; H03H 7/00
[52] U.S. Cl. .......................... 339/14 R; 339/147 R; 333/185
[58] Field of Search .......................... 333/181-185; 339/14 R, 143 R, 147 R, 147 P

[56] References Cited

U.S. PATENT DOCUMENTS

| | | | |
|---|---|---|---|
| 3,200,355 | 8/1965 | Dahlen | 339/147 R |
| 3,462,715 | 8/1969 | Schor | 339/147 R |
| 3,597,711 | 8/1971 | Buckley | 339/147 P |
| 4,079,343 | 3/1978 | Nijman | 339/147 R |
| 4,083,022 | 4/1978 | Nijman | 339/147 R |
| 4,126,370 | 11/1978 | Nijman | 339/143 R |
| 4,260,966 | 4/1981 | Boutros | 339/147 R |

*Primary Examiner*—Gil Weidenfeld
*Assistant Examiner*—Gary F. Paumen
*Attorney, Agent, or Firm*—T. L. Peterson; R. C. Turner

[57] ABSTRACT

An electrical connector having a contact with an insulator therearound in an opening in a ground plane. A conductive band surrounds the insulator. A spring supports the band in the ground plane opening in a position electrically connected with the ground plane. A semiconductor diode is mounted in a longitudinal notch in the contact in a position electrically connected therefrom to the band. In one embodiment the insulator is slotted at the notch exposing the diode directly to the band. In another embodiment the band has a ground clip extending to the diode from the band and the contact notches spaced from the ground plane opening. This spacing is longitudinal.

7 Claims, 5 Drawing Figures

ELECTRICAL CONNECTOR FOR TRANSIENT SUPPRESSION

BACKGROUND OF THE INVENTION

This invention relates to an electrical connector, and more particularly to electrical connectors which can function under a large electromagnetic pulse (EMP) transients and which can function without interruption when subjected to shock and vibration.

PRIOR ART STATEMENT

It is known to mount a semiconductor diode in a longitudinal notch in a contact in a ground plane opening. In this case a bowed spring mechanically mounts the contact and makes electrical contact with the interior surface of the ground plane opening. For example, see the disclosure of and the prior art cited in copending patent application Ser. No. 480,169 filed Mar. 29, 1983 by G. R. Nieman et al for Electrical Connector Embodying Electrical Circtuit Components.

In the past, electrical connectors of the type identified above have not suppressed transient voltage pulses between the contacts and shell ground. Furthermore, such connectors have not been able to function without circuit interruption when subjected to shock and vibration.

SUMMARY OF THE INVENTION

In accordance with the electrical connector of the present invention, the above-described and other disadvantages of the prior art are overcome by providing a contact surrounded by an insulator which, in turn, is surrounded by a metal band. A spring holds this assembly in an opening through a ground plane. A semiconductor diode is electrically connected between the metal band and the contact.

BRIEF DESCRIPTION OF THE DRAWINGS

In the drawings, which are to be regarded as merely illustrative.

DESCRIPTION OF THE PREFERRED EMBODIMENTS

Figure 1:
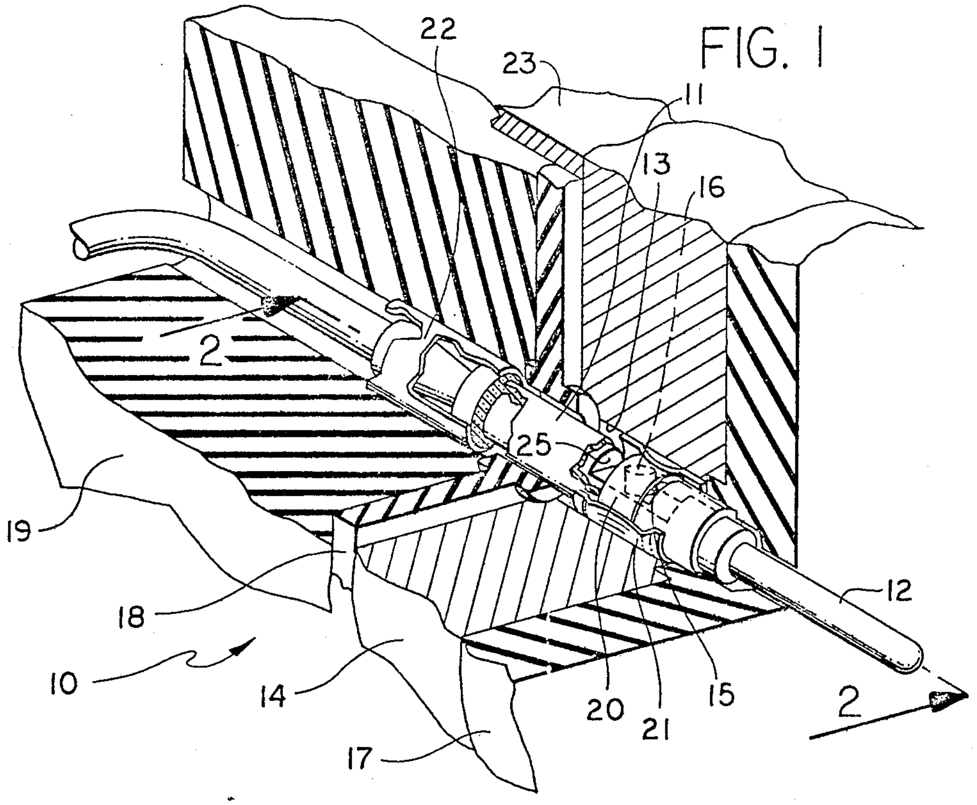
FIG. 1 is a broken away perspective view of an electrical connector constructed in accordance with the present invention.

In the drawings, in FIG. 1, an electrical connector 10 is shown including a ceramic insulator 11. Insulator 11 surrounds a pin contact 12 except for a small opening 15 over a diode 16. The insulator 11 extends well into a front insulator 17 through a center insulator 18 and into a rear insulator 19. In doing so, it provides an electrical creepage path (which is the element of construction that dielectric withstand voltage depends on) to meet common levels of dielectric withstand voltage performance.

The electrical circuit requirements are satisfied through use of a circumferential metal band 20 which contacts the diode 16 through opening 15 in the insulator 11. The band 20 is in circumferential contact with a conventional "MULTILAM" (trademark) spring 21 which is, in turn, in contact with metal ground plane 14. The spring 21 exerts a uniformly distributed load on the circumferential band 20 to assure noninterrupted electrical contact during exposure to shock and vibration. The uniformly distributed load acts to prevent deflection of contact 12 during shock and at the harmonic frequencies of the contact during vibration. Any deflection which might occur will simply be reacted to by the spring 21 which will cause even greater assurance of a non-interrupted circuit.

Figure 2:
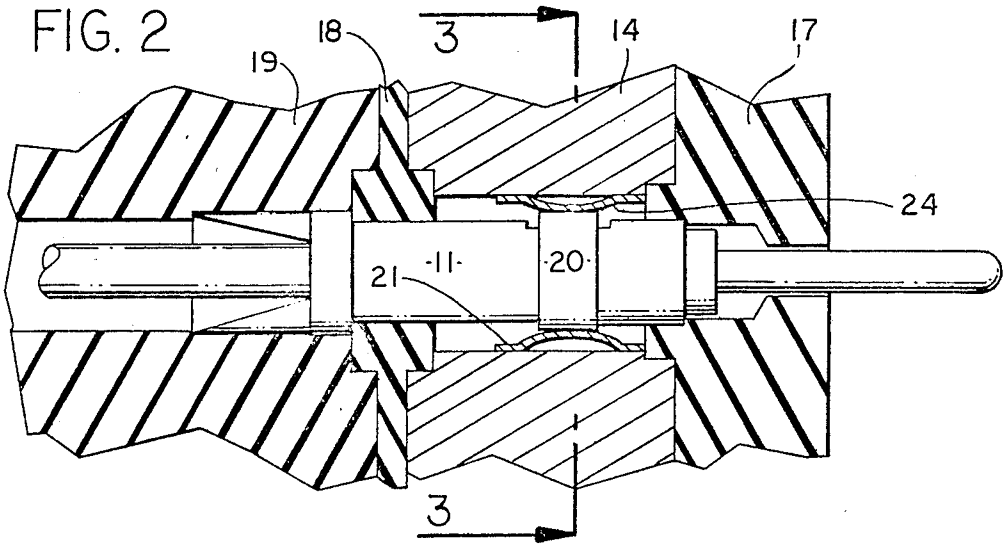
FIG. 2 is a longitudinal sectional view, partly in elevation, of a portion of the electrical connector shown in FIG. 1.
Figure 3:
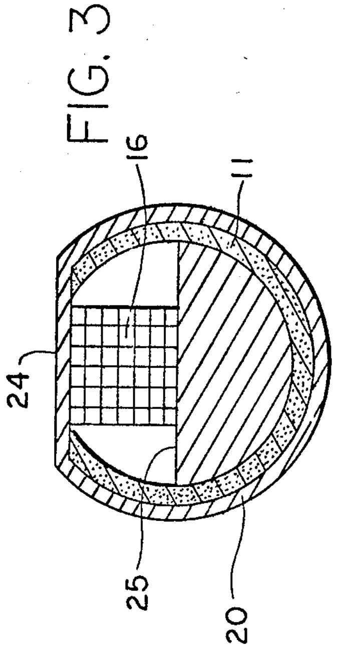
FIG. 3 is a transverse sectional view of the connector taken on the line 3—3 shown in FIG. 2.

Note in FIGS. 2 and 3 that band 20 is flattened at 24 and that diode 16 is connected between band 20 and pin contact 12 in a notch 25 of the latter.

A conventional retention clip 22 is also shown in FIG. 1.

As is conventional, ground plane 14 is maintained in electrical contact with a conventional connector shell 23.

Figure 5:
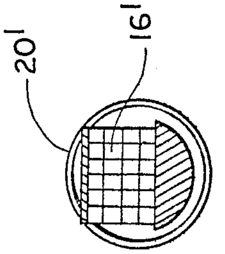
FIG. 5 is a transverse sectional view taken on the line 5—5 shown in FIG. 4.
Figure 4:
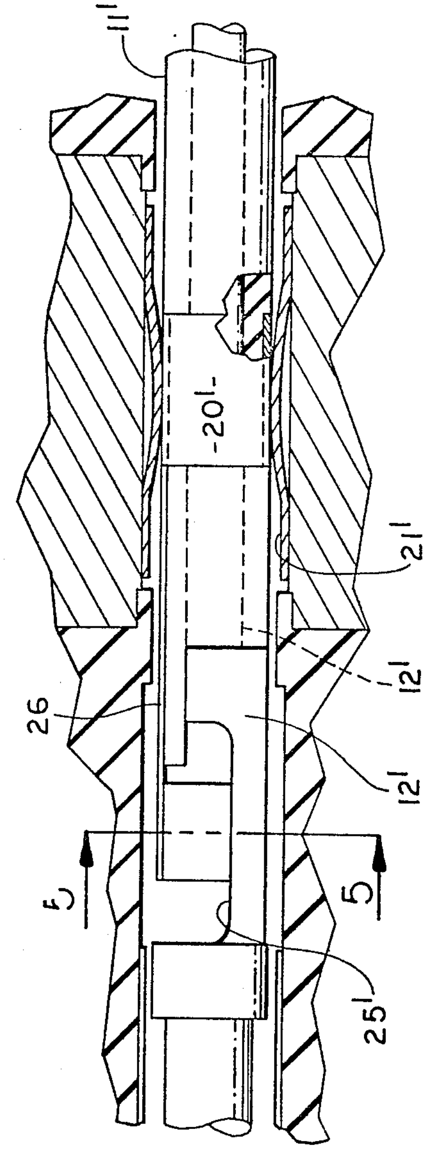
FIG. 4 is a longitudinal sectional view of an alternative embodiment of the present invention.

There is a need to package the connector 10 in a high density layout. For example, the centerline to centerline dimension between contacts in a high density layout may be 0.094 inch. That is, there is a requirement for reduced centerline spacing. This requirement is satisfied by locating insulator 11' (FIGS. 4 and 5) and a circumferential metal band 20' in an area where their diameters can be reduced to an absolute minimum. These parts are, therefore, located near the engaging end of a pin contact 12'. The insulator 11' no longer covers diode 16'. Therefore, an entry hole similar to hole 15 of FIG. 1 is not provided in insulator 11'. Contrariwise, a notch 25' is provided as shown. However, the metal band 20' must now have an extension on it which spans the distance between the band 20' and the diode 16'. This extension is attached to the diode 16' to complete the electrical circuit. Diode 16' is connected to pin contact 12' at the bottom of notch 25' as shown in FIG. 5.

Extension 26 may be fixed to or integral with band 20'.

Springs 21 and 21' may be separate from or intergral with respective corresponding bands 20 and 20'. That is, springs 21, 21' and corresponding bands 20, 20' may be isotropic.

For the function of diode 16 or other complex circuitry, see the copending application.

Complex integrated circuits as circuit components, multiple independently mounted (many contacts) circuit components with multiple grounds may be employed with the present invention with fixed or removable contacts.

What is claimed is:

1. An electrical connector member comprising:

an electrical connector shell:

a ground plane in said shell in electrical contact therewith, said ground plane having an opening therethrough;

a contact in said opening;

a circumferential insulator surrounding said contact inside said opening;

a circumferential conductive band surrounding said insulator inside said opening;

conductive spring means to mount said conductive band in said opening in a position electrically connected with said ground plane; and a circuit component electrically connected between said conductive band and said contact.

2. The invention as defined in claim 1, wherein: said conductive band and said conductive spring means are constructed of one isotropic piece of metal.

3. The invention as defined in claim 1, wherein: said conductive spring means includes a cylindrical sleeve having a plurality of inwardly bowed elongate springs in pressure contact with and in electrical contact with said conductive band.

4. The invention as defined in claim 1, wherein: said contact is notched within said conductive band, said circuit component having one end bonded to said contact in said notch and having its opposite end bonded to said conductive band thereabove.

5. The invention as defined in claim 4, wherein: said circuit component includes a semiconductor diode.

6. The invention as defined in claim 1, wherein: said contact is notched at a position longitudinally spaced from said conductive band, said circuit component having one end conductively bonded to said contact within said notch, and a ground clip electrically connecting said conductive band to the opposite end of said circuit component.

7. The invention as defined in claim 6, wherein: said circuit component includes a semiconductor diode.

* * * * *

UNITED STATES PATENT AND TRADEMARK OFFICE
Certificate

Patent No. 4,572,600

Patented: Feb. 25, 1986

On petition requesting issuance of a certificate for correction of inventorship pursuant to 35 U.S.C. 256, it has been found that the above-identified patent, through error and without any deceptive intent, improperly sets forth the inventorship. Accordingly, it is hereby certified that the correct inventorship of this patent is: Gerald R. Nieman, James E. Thompson, William D. Couper and Clarence L. Clyatt, III.

Signed and Sealed this Twelfth-Day of November, 1991

LARRY L. SCHWARTZ

*Supervisory Patent Examiner*
*Art Unit 322*

REEXAMINATION CERTIFICATE (1514th)

United States Patent [19] [11] B1 4,572,600

Nieman [45] Certificate Issued Jul. 23, 1991

[54] ELECTRICAL CONNECTOR FOR TRANSIENT SUPPRESSION

[75] Inventor: Gerald R. Nieman, Glendale, Ariz.

[73] Assignee: ITT Corporation, New York, N.Y.

Reexamination Request:
No. 90/002,185, Oct. 31, 1990

Reexamination Certificate for:
Patent No.: 4,572,600
Issued: Feb. 25, 1986
Appl. No.: 706,683
Filed: Feb. 28, 1985

[51] Int. Cl.[5] .......................... H01R 4/66; H03H 7/00
[52] U.S. Cl. ...................................... 439/92; 439/608; 439/620; 333/185
[58] Field of Search ............................... 439/620, 608; 333/181-185

[56] References Cited

U.S. PATENT DOCUMENTS

| | | | |
|---|---|---|---|
| 3,275,954 | 9/1966 | Coda et al. | 333/79 |
| 3,450,902 | 6/1969 | Grove | 333/260 |
| 3,582,862 | 6/1971 | Anderson | 339/14 |
| 4,276,523 | 6/1981 | Boutros et al. | 333/182 |
| 4,582,385 | 4/1986 | Couper et al. | 339/147 |
| 4,600,262 | 6/1986 | Nieman et al. | 339/147 |

*Primary Examiner*—Gary F. Paumen

[57] ABSTRACT

An electrical connector having a contact with an insulator therearound in an opening in a ground plane. A conductive band surrounds the insulator. A spring supports the band in the ground plane opening in a position electrically connected with the ground plane. A semiconductor diode is mounted in a longitudinal notch in the contact in a position electrically connected therefrom to the band. In one embodiment the insulator is slotted at the notch exposing the diode directly to the band. In another embodiment the band has a ground clip extending to the diode from the band and the contact notches spaced from the ground plane opening. This spacing is longitudinal.

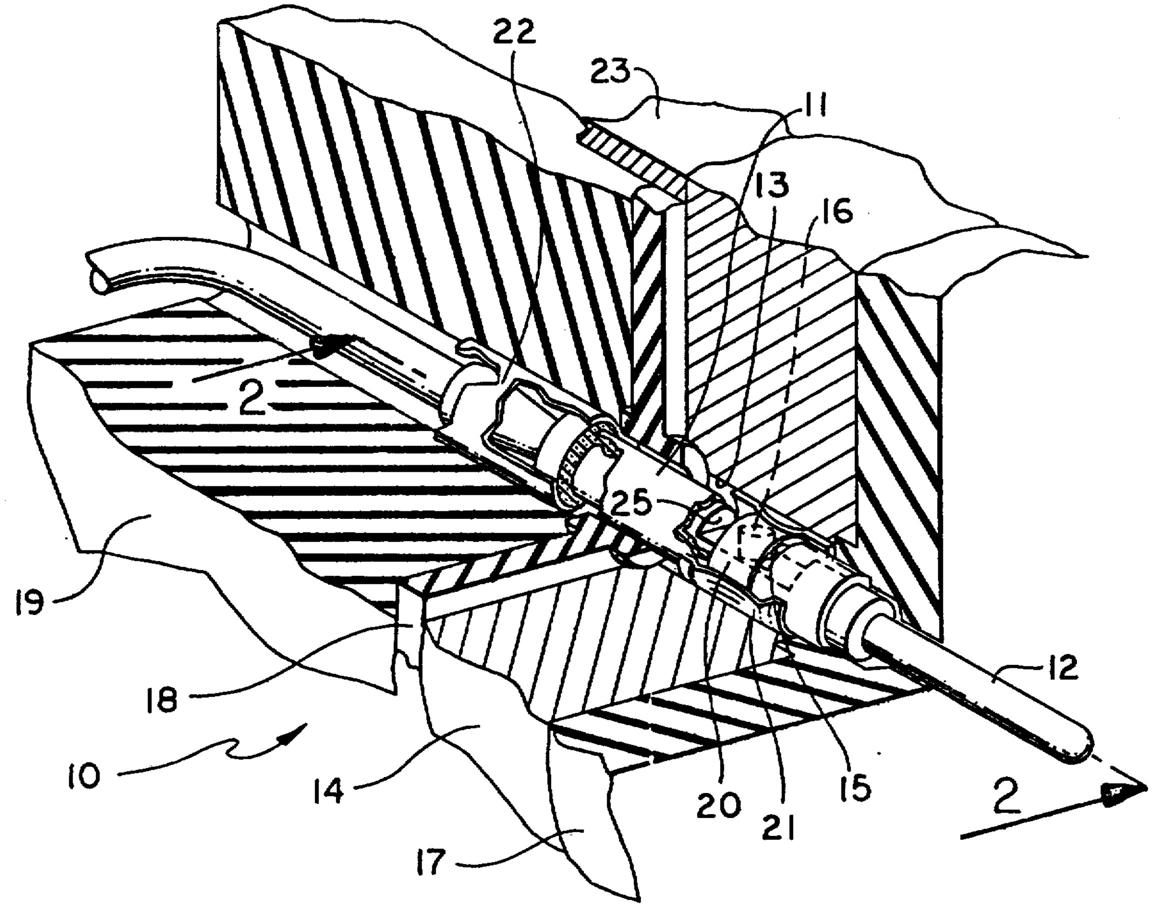

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–7 is confirmed.

New claims 8–10 are added and determined to be patentable.

*8. An electrical connector member comprising:*

*an electrical connector shell;*

*a ground plane in said shell in electrical contact therewith;*

*said ground plane having an opening therethrough;*

*a contact in said opening;*

*a recess formed in the side of said contact providing a flat supporting surface;*

*a semiconductor diode mounted on said supporting surface, said diode having one end conductively bonded to said contact within said recess;*

*a circumferential insulator surrounding said contact inside said opening;*

*a circumferential conductive band surrounding said insulator inside said opening, said band being longitudinally spaced from said diode;*

*conductive resilient means mounting said conductive band in said opening in a position electrically connected with said ground plane; and*

*means electrically connecting said conductive band and said diode.*

*9. An electrical connector member as set forth in claim 8 wherein:*

*said electrically connecting means includes a longitudinally extending extension of said band.*

*10. An electrical connector member comprising:*

*an electrical connector shell;*

*a ground plane in said shell in electrical contact therewith;*

*said ground plane having an opening therethrough;*

*a contact in said opening;*

*a circumferential insulator surrounding said contact inside said opening;*

*a circumferential conductive band surrounding said insulator inside said opening;*

*conductive spring means to mount said conductive band in said opening in a position electrically connected with said ground plane; and*

*a semiconductor diode electrically connected between said conductive band and said contact.*

* * * * *